Figure 1:
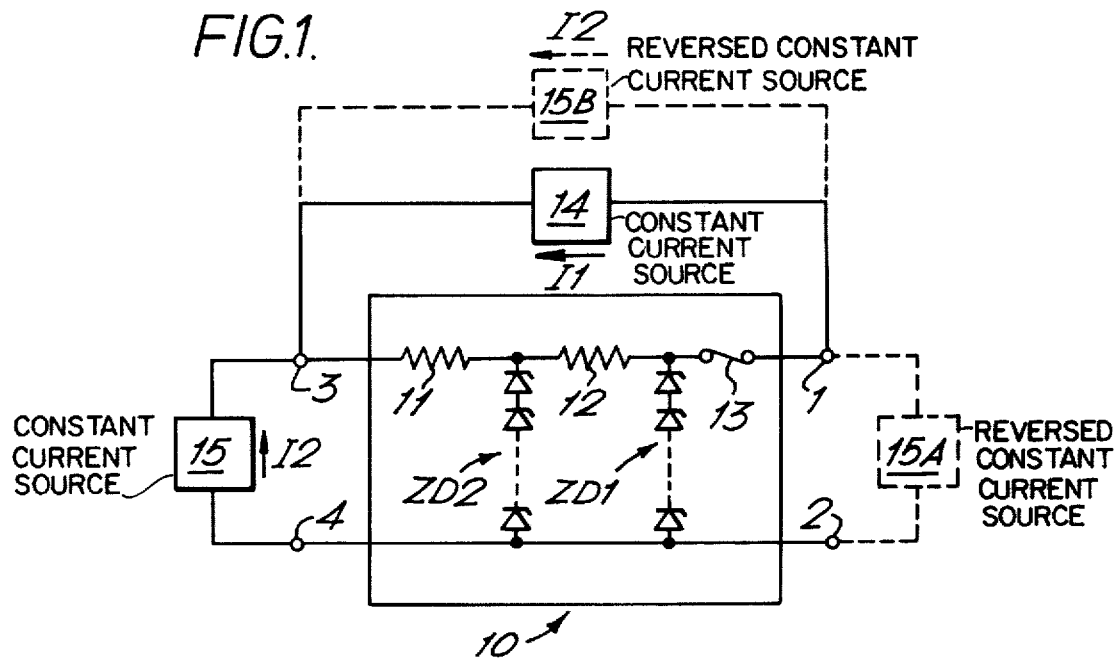

United States Patent [19]

Hawkes et al.

[11] 4,301,403
[45] Nov. 17, 1981

[54] ELECTRICAL CIRCUIT TESTING

[75] Inventors: David W. Hawkes; Ian C. Hutcheon, both of Luton, England

[73] Assignee: Measurement Technology Ltd., Luton, England

[21] Appl. No.: 106,019

[22] Filed: Dec. 21, 1979

[30] Foreign Application Priority Data

Dec. 21, 1978 [GB] United Kingdom ............... 49735/78

[51] Int. Cl.³ .......................................... G01R 27/02
[52] U.S. Cl. ................ 324/62; 324/73 PC; 324/158 D
[58] Field of Search ............... 324/62, 73 PC, 158 D

[56] References Cited

U.S. PATENT DOCUMENTS 3,956,698  5/1976  Malmberg ................ 324/158 D X
4,197,652 12/1979  Davis ....................... 324/73 PC X
4,216,424  8/1980  Vette ....................... 324/62

Primary Examiner—Stanley T. Krawczewicz
Attorney, Agent, or Firm—Young & Thompson

[57] ABSTRACT

A method of testing operation of an electrical circuit involves supplying a test signal to circuit terminals (1 to 4), which signal may be a pulsed signal, to the circuit, thereby to switch off a switch component (ZD1). When the circuit is in this condition, further test signals may be applied to the terminals (1 to 4) to test operation of other circuit components (11, 12, 13, ZD2). The method is particularly applicable to circuits, e.g. diode safety barriers, that are encapsulated and require testing after encapsulation, when only terminals (1 to 4) are exposed for connection into an external circuit.

13 Claims, 2 Drawing Figures

ELECTRICAL CIRCUIT TESTING

DESCRIPTION

This invention relates to a method of testing components of an electrical circuit.

The invention finds particular, though not exclusive, application in the testing, following manufacture, of devices in which electrical circuits are encased such that only input and output terminals are readily accessible.

It is desirable that such electrical devices be tested for correctness of operation of their components after encasing has taken place, since otherwise any faults introduced during encasing are not detected, however, after encasing access generally cannot be obtained for testing individual circuit components or groups of components.

One method of minimising this disadvantage is to provide the device with one or more test points which remain accessible after encasing and such that the required component testing can be effected. This increases the cost of the device and moreover the test points themselves have to be sealed subsequent to testing and this operation can itself adversely affect circuit components. Furthermore, the device cannot conveniently be re-tested during its lifetime.

It is an object of the present invention to provide a method of testing operation of an electrical circuit that can be carried out on a completed, and encapsulated circuit without the need for disturbing components of the circuit or its encapsulation. It is a further object to provide such a method that can easily and quickly be applied to a circuit using conventional and commonplace electrical laboratory equipment.

In accordance with one aspect of the present invention, there is provided a method of testing operation of an electrical circuit, the circuit having a plurality of current paths therethrough and a component capable of changing the impedance of one of the paths, wherein at least one electrical test signal is applied to the circuit to cause said component to change said impedance thereby to permit testing of at least one other component of the circuit.

In accordance with another aspect of the present invention, there is provided a method of testing operation of an electrical circuit, the circuit comprising first and second terminals, first switching means and first resistance means connected together in series and interconnecting said first and second terminals, third and fourth terminals, second switching means interconnecting said third and fourth terminals, second resistance means connecting said third terminal to the junction between said first switching means and said first resistance means, and a conductor interconnecting said second and fourth terminals, wherein the method comprises passing current through said second resistance means thereby to render one of said switching means open circuit, and testing the other of said switching means and said first and second resistance means.

Depending on the configuration of the circuit under test, a plurality of test signals may be applied to obtain desired test results. In some instances, test results can be obtained of the test signal responsive component itself, which may be for example a zener diode. The element of the circuit about which results are obtained can comprise simply a conductor or a component or group of components whose characteristics can be determined separately from those of other components present in the circuit. For example, the operation of individual ones of a plurality of diodes or resistors may be tested.

With some circuits, those protected by a fuse for example, the electrical power applied by the test signal to render or retain a switching element non-conductive whilst the tests are being carried out may have to be pulsed in order that the power rating of the fuse is not exceeded.

In one method embodying the present invention, a circuit comprising two switching elements each of which is electrically connected in parallel with a pair of input terminals and with a pair of output terminals of the circuit, is tested by applying electrical power to terminals of the circuit such as to ensure that only one of said switching elements is non-conductive so that operation of the other element can be tested.

Methods of testing electrical circuits, in accordance with the present invention, will now be described, by way of example, with reference to two embodiments of diode safety barriers, the circuit diagrams of which are shown in the accompanying drawing.

An electrical safety barrier is a device that is interposed between a transducer, such as a thermocouple or photocell, or an instrument in a hazardous environment and measurement or control apparatus, which may be disposed in a safer environment. The barriers may be one-channel to two-channel devices which pass an electrical signal in either direction but which limit the transfer of energy in one direction to a safe level, for example that which cannot ignite explosive vapours or gases in the hazardous environment. Each channel is essentially an energy-diverting circuit comprising forward-connected diodes or Zener diodes to limit the voltage transmitted, and "infallible" series resistors to limit the current. Furthermore, a fuse may be incorporated for additional safety. The barriers may be polarised, that is to say arranged to pass signals of a specified polarity, or they may be non-polarised.

To satisfy national and international safety standards, components of the barriers are tested before and during manufacture, and each device is further tested, after assembly, and the encapsulated, fitted with vibration-proof terminals and enclosed in a protective metal case.

A shunt diode safety barrier is an electrical device that comprises two diodes, or two diode chains, connected in parallel with each other and in parallel with a pair of input terminals and a pair of output terminals of the device. The device is encapsulated for protection and electrical insulation, leaving the terminals exposed for connecting the barrier into an external circuit. A current-limiting resistor, located within the encapsulation, is connected in series between one of the terminals and the diodes. In addition, a further resistor is usually employed, interconnecting the diodes, and a fuse is incorporated in the device.

Correct operation of the diodes, usually Zener diodes, has to be ascertained after encapsulation. This is made difficult owing to the diode connecting resistor, which is desirably of low resistance in order to minimise the total resistance introduced into the external circuit by the presence of the barrier.

Figure 2:
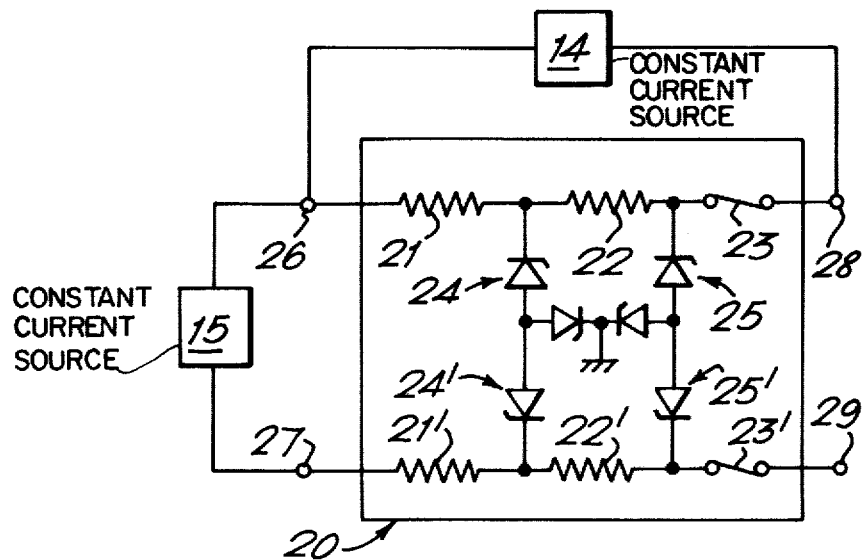

FIG. 1 is a circuit diagram of a first embodiment of testing equipment for practicing the present invention; and FIG. 2 is a view similar to FIG. 1 but showing a second embodiment of the testing equipment.

In FIG. 1 of the drawing, a shunt diode safety barrier 10 is encapsulated so as to leave first and second pairs of terminals, 1, 2 and 3, 4 disposed for connection into an external circuit. The barrier 10 comprises two Zener diode chains ZD1 and ZD2, which are connected in parallel with each other and with the pairs of terminals. The barrier 10 also comprises a current limiting resistor 11, of resistance RCL, a diode-connecting resistor 12, of resistance RDD, and a fuse 13, of resistance RF.

The barrier 10 is to be tested to determine the value of the current-limiting resistor 11, and also to check the correct operation of the Zener diode chains ZD1 and ZD2. The diode-connecting resistor 12 is nominally of resistance 10 ohms, and to carry out the above-mentioned measurements, a sufficiently large current is passed through it so that one of the diode chains ZD1 and ZD2 is switched off, thereby allowing measurements to be made on the other chain. To effect these measurements, a first constant current source 14 is connected between the external terminals 1 and 3 so as to produce a current I1, and a second constant current source 15 is connected between the external terminals 3 and 4 so as to produce a current I2.

It will be appreciated that in the absence of the source 14, the current I2 from the source 15 would split into two paths, a first path being through the resistor 11 and diode chain ZD2, and a second path through the resistors 11, 12 and diode chain ZD1. The ratio in which the current divides cannot be determined if the diode chains ZD1 and ZD2 have similar nominal breakdown voltages, which is usually the case in practice. Accordingly, the individual characteristics of ZD1 and ZD2 cannot be found. However, with current I1 being passed between terminals 1 and 3 by means of the source 14, a voltage VB = I1 × RDD is developed across the resistor 12. If the current I2 is conducted entirely through the diode chain ZD2, then the voltage drop, VDB, across the diode chain ZD1 is given by VDB = VZD2 − VB, where VZD2 is the voltage drop across the diode chain ZD2. This condition can be achieved by ensuring that I1 is of high enough value to reduce the voltage VDB below the Zener voltage of the diode chain ZD1. Although a small leakage of current will flow through the diode chain ZD1, provided that the current I1 is high enough, the voltage drop VDB will be reduced to the point where the leakage current through the diode chain ZD1 is negligible in comparison with the current I2 through the diode chain ZD2. For example, the leakage current can be arranged not to exceed 0.1% of I2.

A range can be defined for the current I1 which ensures that the Zener diode chain ZD1 is substantially non-conducting, and the corresponding range for the voltage drop VDB across the chain ZD1 then lies inside the characteristic extending from the Zener breakdown to the forward conduction of the chain ZD1. In this condition, the voltage drop VZD2 across the diode chain ZD2 will be independent of the current I1, the current flow through the diode chain ZD2 being constant and equal to I2.

With the constant current sources 14 and 15 arranged as described, tests can now be carried out on the barrier 10 to determine its correct operation.

The voltage V2 between the terminals 3 and 4 is measured at two different values of the current I1 within its allowed range, and if ΔI1 is the difference in the two values of I1 chosen, and ΔV2 is a corresponding difference in V2, then, since VZD2 is constant, the value, RCL, of the current limiting resistor 11 is given by (ΔV2/ΔI1). Furthermore, VZD2 = V2 − (I1 + I2) RCL, where V2 is the potential difference between the terminals 3 and 4 at any value of I1 within its above-mentioned range.

A check can be carried out to ensure that the diode chain ZD1 was turned off during the measurements of RCL and VZD2, by supplying a current across terminals 1 and 2 of magnitude equal to the leakage current IL of the diode chain ZD1. Such a condition will have been obtained provided that the voltage then measured across terminals 1 and 2 is greater than VDB at both of the values of I1 used in the test. It has been assumed in this instance that the voltage drop across the fuse 13 is negligible, but its value can be taken into account if necessary.

It will be appreciated that the barrier 10 is of symmetrical configuration about the resistor 12. Accordingly, by connecting the current source 15 to the terminals 1 and 2 instead of to the terminals 3 and 4, and by reversing the direction of current flow from the source 14, (as shown in dotted outline at 15A) the resistance of the fuse 13 and the value of the potential drop, VZD1, along the diode chain ZD1 can be determined by carrying out corresponding measurements to those described above.

Further tests can be carried out to determine the forward voltage drops of the diode chains ZD1 and ZD2, by reversing the directions of flow of the currents I1 and I2.

The value of the diode-connecting resistor 12 can be found by subtracting the already-determined values of the resistances of the current-limiting resistor 11 and the fuse 13 from the total end-to-end resistance of the barrier 10.

It is found in practice that the range allowed for the current I1 only permits values of I1, which, if continuously applied, would rupture the fuse 13 and overload the current-limiting resistor 11. Accordingly, the currents I1 and I2 from the sources 14 and 15 are applied in pulses of insufficient duration and duty cycle to cause these adverse effects.

Difficulties can be found in determining the value of the resistance RF of the fuse 13 even if the current I1 from the source 14 is applied as very narrow pulses, since the resistance RF may change significantly between the two test currents used to provide ΔI1, due to self-heating and the high temperature coefficient of fuses in general. It will be appreciated that such difficulties will not arise with the determination of the resistances RCL and RDD because of their relatively low temperature coefficients and high thermal capacity, which renders any change in their resistance of insignificant amount. To overcome this difficulty, the source 15 is connected in parallel with the source 14 between the terminals 1 and 3 (as indicated in dotted outline at 15B), so that the total current flowing from terminal 1 to terminal 3 is I1 + I2. The voltage V1 between the terminals 1 and 3 is then measured at two test currents, I1′ and I1″, to give corresponding values V1′ and V1″.

$$\text{Define } REE' = \frac{V1'}{I1' + I2} \text{ and } REE'' = \frac{V1''}{I1'' + I2}.$$

Then REE″ − REE′ corresponds to the change in the end-to-end resistance of the barrier 10 when the current from the source 14 is changed from I1′ to I1″. Since the change in resistance of resistors 11 and 12 is negligible compared with that of the fuse 13, this difference corresponds to the change in the resistance of the fuse between the two test currents used. Defining $$REE'' - REE' = \delta RF, \text{ then}$$
$$RFI1 = \frac{V2'' - V2' - (I1'' + I2)\delta RF}{I1'' - I1'}$$
$$VZD1' =$$
$$\frac{(I1'' + I2)V2' + (I1' + I2)(I1'' + I2)\delta RF - (I1' + I2)V2''}{I1'' - I1'}$$
$$RDD = REE' - RFI1 - RCL$$

Measuring the end-to-end resistance at low current (i.e. a few milliamps) then subtracting RCL and RDD from this will give the cold resistance of the fuse, RF.

If either of the diode chains ZD1 and ZD2 has failed in open circuit condition, the value of the resistance of the fuse obtained from the last-mentioned equation will be zero ohms.

It will be appreciated that other tests can be carried out on the completely assembled barrier 10 after its encapsulation, using the method of the present invention.

It will furthermore be appreciated that as far as the Zener diode chains ZD1 and ZD2 are concerned the results refer to the chain as a whole, and where the chain comprises more than one diode, the method cannot be used to indicate the condition of an individual diode where this condition does not affect the operation of the entire chain.

Values of the components of an exemplary barrier 10 determined by the present invention are:
RCL: 311.61 ohms
RDD: 9.89 ohms
RF: 11.29 ohms
VZD2: 30.03 volts
VZD1: 29.55 volts FIG. 2 shows a further embodiment of a diode safety barrier, in which the diodes are connected in star formation.

A star-connected barrier 20 can be treated as three separate barriers for the purpose of testing, one extending between each channel and earth and one between the channels themselves.

The barriers extending between each channel and earth, therefore, comprise a current-limiting resistor 21, 21', a diode interconnecting resistor 22, 22', a fuse 23, 23' and two diode chains, represented by single diodes, 24, 25, 24', 25' respectively. The barrier has a pair of input terminals 26, 27 and a pair of output terminals 28, 29.

Testing between each channel and earth can be accomplished individually as described above. Tests can be made on the barrier between the channels provided that the voltage V2 instead of being measured between terminals 26 and 27 is measured between terminals 26 and 29 of the device 20. By this means, the current limiting resistors 21 and 21' play no part in this particular measurement.

It will be appreciated that the method of the present invention may be used to validate electrical circuits other than those specifically disclosed herein.

We claim:

1. A method of testing operation of an electrical circuit, the circuit having a plurality of current paths therethrough and a component capable of changing the impedance of one of said paths, in which method at least one electrical test signal is applied to said circuit to cause said component to change said impedance thereby to permit testing of at least one other component of said circuit.

2. A method according to claim 1, comprising the further step of measuring the voltage between two terminals of said circuit of two values of current flowing therethrough, thereby to test the impedance of a component of said circuit.

3. A method according to claim 1, in which said component comprises an electrical switching component and said test signal is arranged to switch said component from one state to another state.

4. A method according to any of claims 1 to 3, in which said component comprises at least on diode.

5. A method according to claim 4, in which said at least one diode is a Zener diode.

6. A method of testing operation of an electrical circuit, the circuit comprising first and second terminals, first switching means and first resistance means connected together in series and interconnecting said first and second terminals, third and fourth terminals, second switching means interconnecting said third and fourth terminals, second resistance means connecting said third terminal to the junction between said first switching means and said first resistance means, and a conductor interconnecting said second and fourth terminals, which method comprises passing current through said second resistance means thereby to render one of said switching means open circuit, and testing the other of said switching means and said first and second resistance means.

7. A method according to claim 6, wherein said current comprises current from a first constant current source arranged to flow between said third terminal and said first terminal, and current from a second constant current source arranged to flow between said second terminal and said first terminal.

8. A method according to claim 7, wherein the voltage between said first and second terminals is measured at two different values of current from said second source, thereby to test the resistance value of said first resistance means and to test the voltage drop across said other switching means.

9. A method according to claim 6, wherein said first resistance means has a high temperature coefficient, and wherein said current comprises current from first and second constant current sources connected in parallel between said first and third terminals.

10. A method according to claim 9, wherein the voltage between said first and third terminals is measured at two different values of current supplied by one of said sources, thereby to test the resistance value of said resistance means.

11. A method according to claim 6, in which said first and second switching means each comprises at least one diode.

12. A method according to claim 11, in which said at least one diode is a Zener diode.

13. A method according to claim 1 or 6, in which said testing is effected by a pulsed signal.

* * * * *